United States Patent
Zerbe et al.

(10) Patent No.: US 7,005,939 B2
(45) Date of Patent: Feb. 28, 2006

(54) INPUT/OUTPUT CIRCUIT WITH ON-CHIP INDUCTOR TO REDUCE PARASITIC CAPACITANCE

(75) Inventors: Jared L. Zerbe, Woodside, CA (US); Vladimir M. Stojanovic, Stanford, CA (US); Mark A. Horowitz, Menlo Park, CA (US); Pak S. Chau, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 184 days.

(21) Appl. No.: 10/431,147

(22) Filed: May 6, 2003

(65) Prior Publication Data

US 2004/0155675 A1    Aug. 12, 2004

Related U.S. Application Data

(60) Provisional application No. 60/445,946, filed on Feb. 7, 2003.

(51) Int. Cl.
 *H01P 5/12* (2006.01)
(52) U.S. Cl. ............................ 333/100; 333/5; 333/12; 333/33; 336/200
(58) Field of Classification Search ................ 333/100, 333/33, 5, 12; 336/200
See application file for complete search history.

(56) References Cited

U.S. PATENT DOCUMENTS

| | | | |
|---|---|---|---|
| 4,684,438 A * | 8/1987 | Lazzari ........................ 216/22 |
| 5,751,015 A | 5/1998 | Corbett et al. | |
| 5,861,659 A | 1/1999 | Okabe | |
| 5,969,929 A | 10/1999 | Kleveland et al. | |
| 6,097,066 A | 8/2000 | Lee et al. | |
| 6,175,727 B1 * | 1/2001 | Mostov ....................... 455/307 |
| 6,329,694 B1 | 12/2001 | Lee et al. | |
| 6,433,665 B1 * | 8/2002 | Huang et al. ................ 336/200 |
| 6,448,865 B1 * | 9/2002 | Miller .......................... 333/33 |
| 6,476,704 B1 * | 11/2002 | Goff ........................... 336/200 |
| 6,703,907 B1 * | 3/2004 | van der Wagt ................ 333/5 |

FOREIGN PATENT DOCUMENTS

JP         360000769 A    1/1985

OTHER PUBLICATIONS

C. Patrick Yue and S. Simon Wong, "On-Chip Spiral Inductors with Patterned Ground Shields for Si-Based RF IC's," IEEE Journal of Solid-State Circuits, May 1988, vol. 33, No. 5.

(Continued)

*Primary Examiner*—Benny Lee
*Assistant Examiner*—Kimberly Glenn
(74) *Attorney, Agent, or Firm*—Vierra Magen Marcus Harmon & DeNiro LLP

(57) ABSTRACT

An I/O circuit disposed on an integrated circuit substrate and having reduced parasitic capacitance. The I/O circuit includes a signal line segmented into a first signal line segment and a second signal line segment, and an inductive structure disposed between the first and second signal line segments. An on-chip termination element is coupled to the first signal line segment, and an electrostatic discharge (ESD) element is coupled to the second signal line segment.

27 Claims, 5 Drawing Sheets

OTHER PUBLICATIONS

Ali Hajimiri and Thomas H. Lee, "Design Issues in CMOS Differential LC Oscillators," IEEE Journal of Solid-State Circuits, May 1999, vol. 34, No. 5.

Sunderarajan S. Mohan, et al., "Simple Accurate Expressions for Planar Spiral Inductances," IEEE Journal of Solid-State Circuits, Oct. 1999, pp. 1419-1424, vol. 34, No. 10.

Marc Tiebout, "Low-Power Low-Phase-Noise Differentially Tuned Quadrature VCO Design in Standard CMOS," IEEE Journal of Solid-State Circuits, Jul. 2001, pp. 1018-1024, vol. 36, No. 7.

Sedra et al., "Microelectronic Circuits", 1998, Oxford University Press, 4th Edition, pp. 358-359.

Cao, "A Partial Design Analysis of the Samsung KM416H4301T-G1-4Mx16 Double Data Rate SDRAM", Semiconductor Insights Inc., Mar. 1999.

* cited by examiner

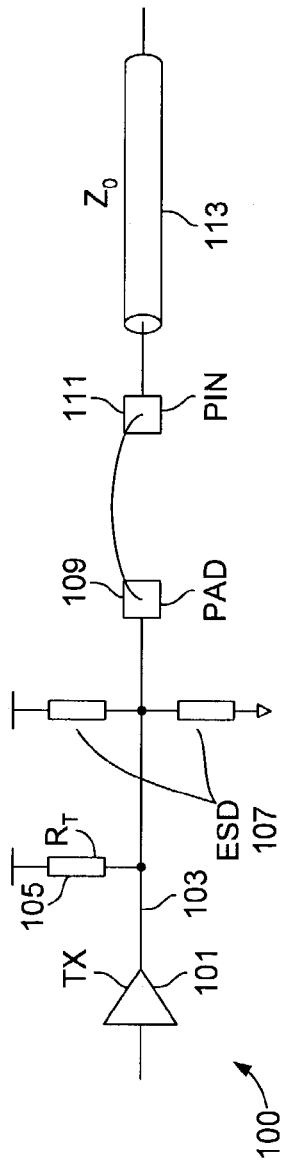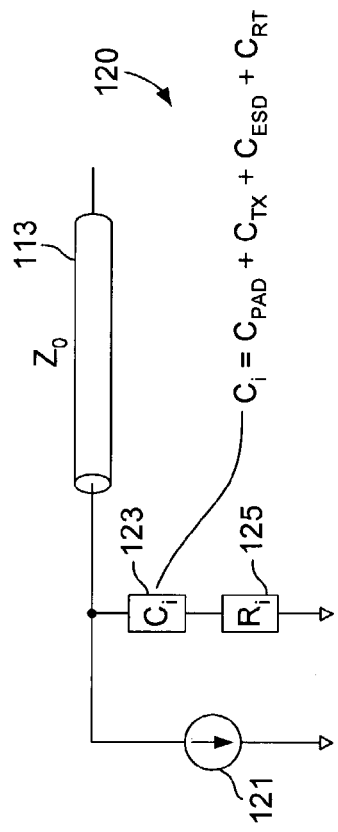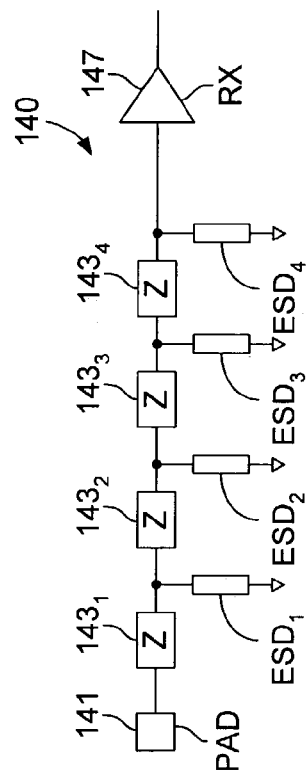
FIG. 1 (Prior Art)
FIG. 2 (Prior Art)
FIG. 3 (Prior Art)

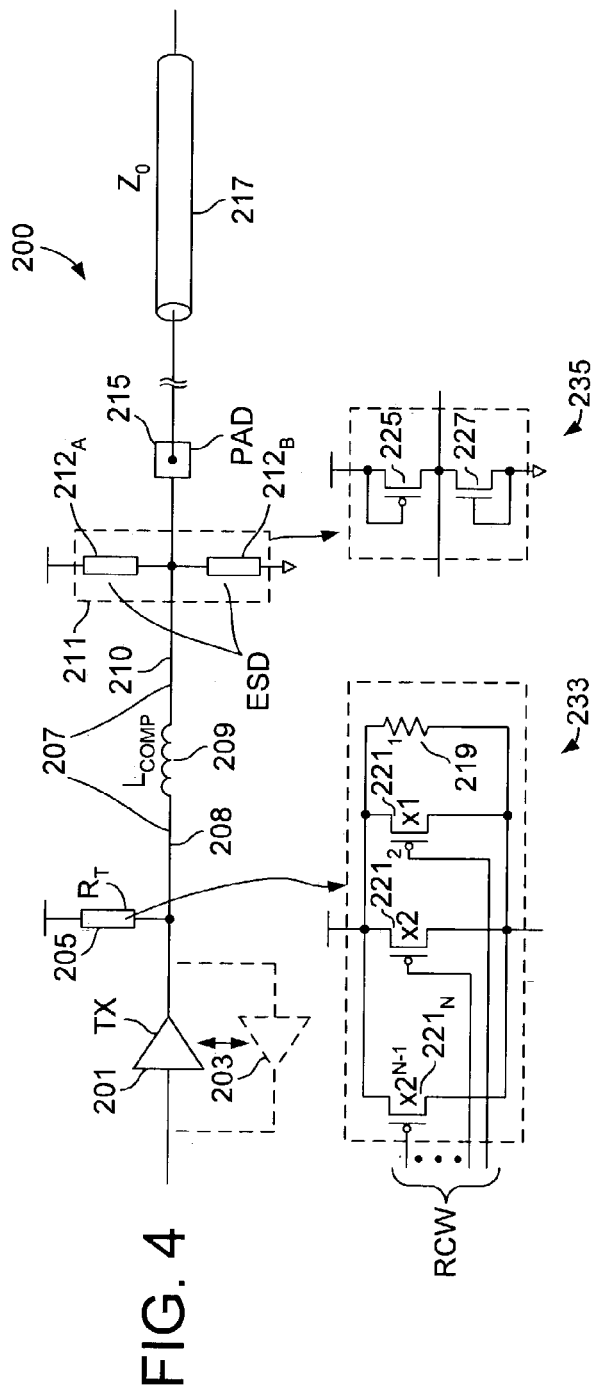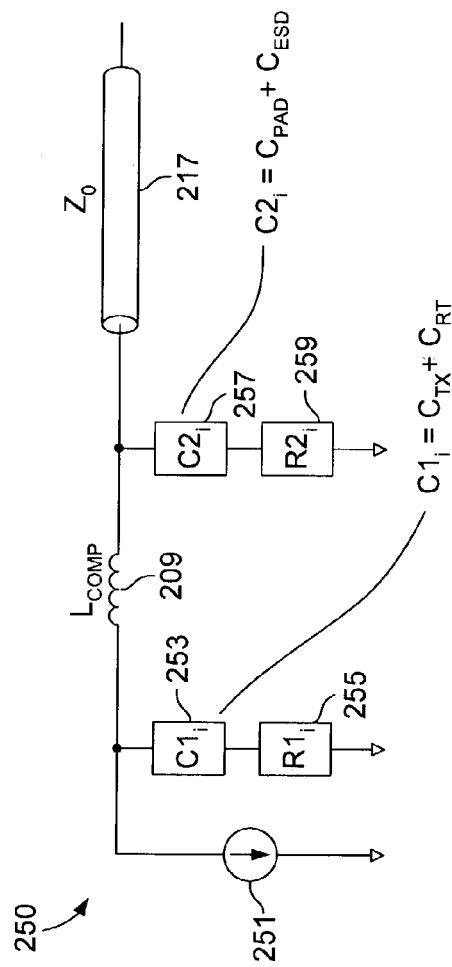
FIG. 4
FIG. 5

INPUT/OUTPUT CIRCUIT WITH ON-CHIP INDUCTOR TO REDUCE PARASITIC CAPACITANCE

CROSS-REFERENCE TO RELATED APPLICATIONS

This application claims priority from U.S. Provisional Application No. 60/445,946 filed Feb. 7, 2003. U.S. Provisional Application No. 60/445,946 is hereby incorporated by reference in its entirety.

FIELD OF THE INVENTION

The present invention relates generally to high speed signaling within and between integrated circuit devices, and more particularly to reducing parasitic capacitance in an input/output circuit of an integrated circuit device.

BACKGROUND

As data rates advance into the gigahertz range, even small parasitic capacitances exhibited by input/output circuit components begin to produce significant signal attenuation. Referring to prior-art output circuit 100 of FIG. 1, a transmitter 101, termination element 105, electrostatic discharge (ESD) element 107 and connection pad 109 are all sources of parasitic capacitance, the sum of which may be lumped into a total parasitic capacitance, $C_i$, as shown in the corresponding small-signal model 120 of FIG. 2. The resistance of the termination element, $R_T$, is typically selected to match the impedance, $Z_0$, of an external signaling path 113 and, when lumped with the output resistance of the transmitter 101 and leakage of the ESD element 107, may be modeled as a lumped resistance $R_i$. The transmitter is modeled as a constant current source 121 coupled in parallel with the RC branch formed by $R_i$ and $C_i$. The parasitic capacitance has two undesired consequences. First, the RC branch produces significant high-frequency loss, limiting the bandwidth of the output circuit. Second, the parasitic capacitance contributes a frequency-dependent component to the termination impedance of the output circuit (i.e., $Z=R_i+1/j\omega C_i$), thereby increasing the likelihood of undesired reflections due to mismatch between the signal path impedance, $Z_0$, and the termination impedance.

FIG. 3 illustrates one prior-art technique for reducing parasitic capacitance of an ESD element within an input circuit 140. A unified ESD element is distributed into a number of smaller ESD elements, $ESD_1$–$ESD_4$, and a corresponding set of impedance elements, $143_1$–$143_4$, are disposed in the signal path between adjacent ESD elements and between a connection pad 141 and a first one of the ESD elements, $ESD_1$. By selecting the impedance elements to have a desired impedance, the path between the pad 141 and a final-one of the ESD elements, $ESD_4$, is transformed into a transmission line with substantially reduced high-frequency loss.

Unfortunately, the multiple impedance elements 143 consume significant die area; a consumption that is multiplied by the number of distributed ESD structures 140 within the integrated circuit. Also, the impedance elements 143 are tuned to achieve a transmission line between the pad and the final ESD element, $ESD_4$, leaving other sources of parasitic capacitance unmitigated. Referring to FIG. 1, for example, the parasitic capacitance of the termination element 105 and transmitter 101 remain as significant sources of high frequency loss.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1 illustrates a prior-art output circuit;

FIG. 2 illustrates a small-signal model of the output circuit of FIG. 1;

FIG. 3 illustrates a prior-art technique for reducing parasitic capacitance of an ESD element within an input circuit;

FIG. 4 illustrates an input/output (I/O) circuit according to an embodiment of the invention;

FIG. 5 illustrates a small-signal model of the I/O circuit of FIG. 4;

DETAILED DESCRIPTION

Figure 6:
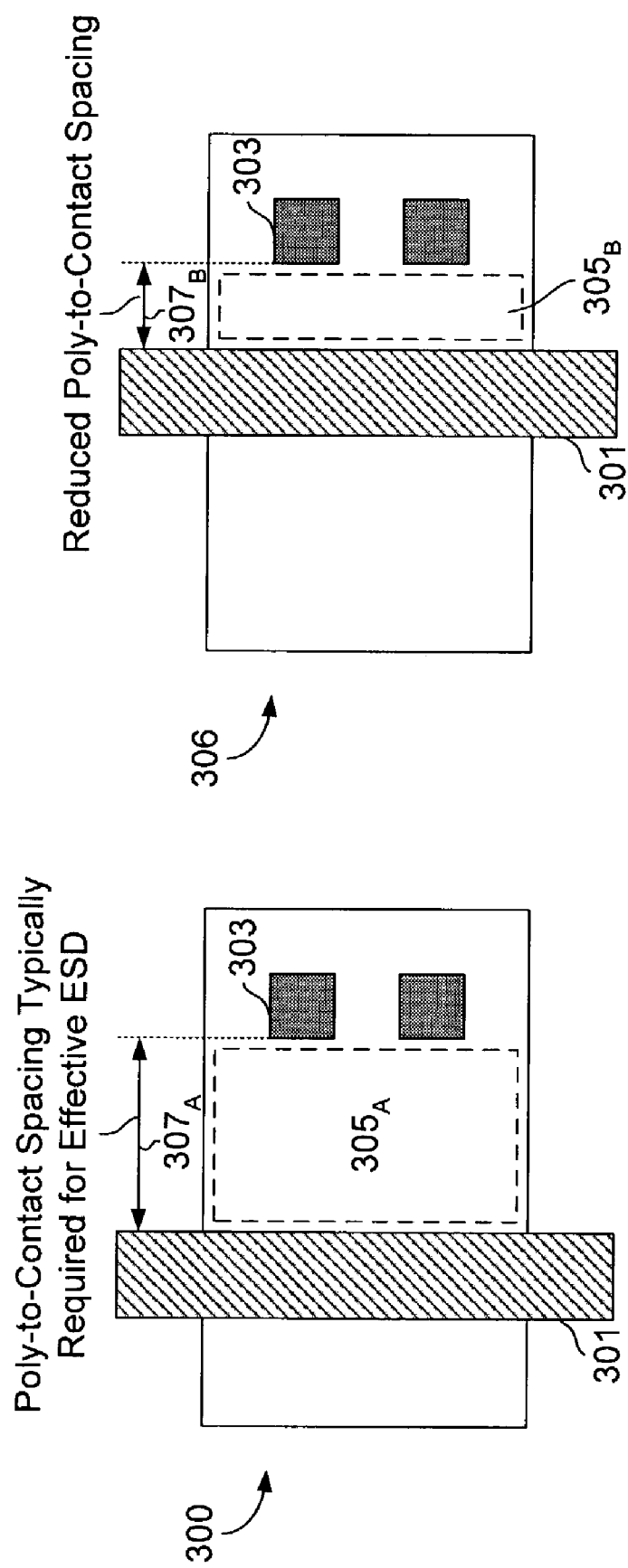
FIGS. 6A and 6B illustrate reduced gate-to-contact spacing made possible by embodiments of the invention.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal.

In embodiments of the present invention an inductive structure is disposed within an input/output (I/O) circuit of an integrated circuit device such that the connection pad and complete ESD structure are located on one side of the inductive structure, and a termination element and communication circuit (i.e., transmitter and/or receiver) are located on the other side of the inductive structure. By distributing the sources of parasitic capacitance within the I/O circuit on opposite sides of the inductive structure, a net reduction in reactive impedance is achieved, reducing high-frequency loss and signal reflections. Also, because a single inductive structure is used, the signal routing complexity and die space consumption are reduced relative to the distributed impedance elements described in reference to the prior art circuit of FIG. 3. In a differential signaling embodiment of the invention, an on-chip differential inductor is used to boost bandwidth. Reverse routing of oppositely directed signals achieves a mutual inductance in the differential inductor over and above the winding inductance present in either single-ended path, thereby increasing the area-efficiency of the inductor. In other embodiments, area-efficient inductive structures are produced by winding a conductor around one or more connection pads. Ferromagnetic material may be stacked in via structures under the pad to provide a ferromagnetic core to further boost inductance.

I/O Circuit with On-Chip Inductor

FIG. 4 illustrates an I/O circuit 200 according to an embodiment of the invention. The I/O circuit includes a transmitter 201, signal line 207, termination element 205, ESD structure 211, connection pad 215 and inductive structure 209, all disposed on one or more substrate layers of an integrated circuit (IC). The inductive structure 209 is coupled in series with the signal line 207, segmenting the signal line 207 into a termination line segment 208 and an interface line segment 210. The ESD structure 211 and pad 215 are coupled to the interface line segment 210, and the transmitter 201 and termination structure are coupled to the termination line segment 208. Thus, as shown in the small-signal model of FIG. 5, the inductive structure 209 separates the lumped parasitic capacitance of the I/O circuit 200 into two parasitic capacitances, $C1_i$ and $C2_i$, with parasitic capacitance $C1_i$ being a sum of the parasitic capacitances of the transmitter 201 and the termination element 205 (i.e., $C_{TX}+C_{RT}$), and capacitance $C2_i$ being a sum of the parasitic capacitances of the pad 215 and the ESD structure 211 ($C_{PAD}+C_{ESD}$).

In one embodiment, the transmitter 201 is implemented by a pull-down type output driver that sinks current through the termination element 205 to modulate the level of the signal line 207 and therefore may be modeled as a constant current source 251 in FIG. 5. In an alternative embodiment, the transmitter 201 is implemented by a push-pull driver that alternately sources and sinks current (i.e., according the data to be transmitted). Other types of transmit circuits may be used in alternative embodiments. Also, the circuit 200 may include a receiver 203 (itself exhibiting a parasitic capacitance, $C_{RX}$) instead of, or in addition to, the transmitter 201.

The termination element includes a resistive component formed, for example, from polysilicon and sized to provide a resistance value nominally equal to an anticipated impedance of an external signal path 217 (i.e., impedance $Z_0$). In one embodiment, depicted in expanded view 233 in FIG. 4, the termination element additionally includes N binary weighted transistors $221_1$–$221_N$ (e.g., having progressively larger width-length ratios from transistor to transistor) coupled in parallel with a resistive component 219. The transistors 221 are switched between conducting and non-conducting states in response to respective bits of a resistance control word (RCW) to enable digital control of the overall resistance of the termination element 205. Note that the drain terminal of each of the transistors 221 is coupled to the termination line segment 208 and therefore contributes a parasitic capacitance to the circuit 200 according to the area between the drain contact and the transistor gate.

The ESD structure 211 may be implemented by any structure capable of discharging electrostatic energy (e.g., a voltage spike generated according to the human body model (HBM) or charged device model (CDM)) and in one embodiment includes a pair of reverse-biased diodes 212A and 212B coupled between the interface line segment 210 and respective reference voltages (i.e., a supply voltage and ground in this example). As shown in expanded view 235, the diodes may be implemented by transistors 225 and 227 configured in a reverse-biased diode configuration such that the cathode of each diode is coupled to the interface line segment 210. The drains of each of the transistors 225 and 227 is coupled to the interface line segment 210 and therefore contributes a parasitic capacitance to the circuit 200 according to the area between the drain contact and the transistor gate.

The connection pad 215 is disposed on the IC substrate along with the ESD structure 211, inductive structure 209, termination element 205 and transmit circuit 201 (and/or receiver 203). In one embodiment, the connection pad 215 is wire bonded to an external pin which is soldered or otherwise coupled to the external signal path 217. The pin is secured, along with other pins wire bonded to other connection pads, by a ceramic or plastic housing which encapsulates the integrated circuit containing the circuit 200. In an alternative embodiment, the integrated circuit device need not be encapsulated within a housing and the connection pad 215 may be directly coupled to the external signal path (e.g., by solder bump, solder ball, pressure contact, etc.).

In one embodiment, the inductance of the inductive structure 209 is selected to negate the reactance of the sum of parasitic capacitances, $C1_i$ and $C2_i$ for a target operating frequency (i.e., $X_{C1}+X_{C2}+X_L=0$ for the target operating frequency). By this arrangement, the overall output impedance of the I/O circuit (termination impedance in the case of a receiver) is primarily resistive at the target operating frequency and corresponds to the impedance, $Z_0$, of the external signal path 217. Thus, both high-frequency loss due to parasitic capacitance, and signal reflections caused by impedance mismatch are substantially reduced. Also, in one embodiment the inductive structure 209 is implemented by a single on-chip inductor, saving considerable die space relative to the prior-art distributed ESD structure of FIG. 3.

In addition to reducing high-frequency loss and signal reflections, the inductive structure 209 provides additional isolation between termination line segment 208 and an ESD event. That is, back-EMF (electro-motive force) generated within the inductive structure 209 in response to current changes, resists current surges and therefore provides additional ESD protection for the termination element 205 and transmitter 201 (and/or receiver 203). This additional ESD protection is particularly beneficial when MOS transistors are coupled to the termination line segment 208 (e.g., transistors within the transmitter 201, receiver 203 and/or termination element 205), because the minimum gate-to-contact spacing in such transistors may be reduced relative to the spacing typically required by ESD design rules. FIGS. 6A and 6B illustrate this result in exemplary MOS transistors 300 and 306, each having a gate 301 and drain (or source) contacts 303. As shown, the distance $307_A$ between the gate 301 and contacts 303, in transistor 300 (i.e., required by typical ESD rules) may be reduced to distance 307B of transistor 306 due to the additional ESD protection provided by the inductive structure 209 of FIG. 4. Because the parasitic capacitance of MOS transistors within the transmitter and termination structure is proportional to the area between the gate 301 and contacts 303 (i.e., $305_A$ and $305_B$), the reduced polygate-to-contact spacing made possible by the addition of inductive structure 209 of FIGS. 4 and 5 further reduces the parasitic capacitance of the termination element 205 and transmitter 201 (and/or receiver 203).

On-Chip Differential Inductor to Reduce Loss

Figure 7:
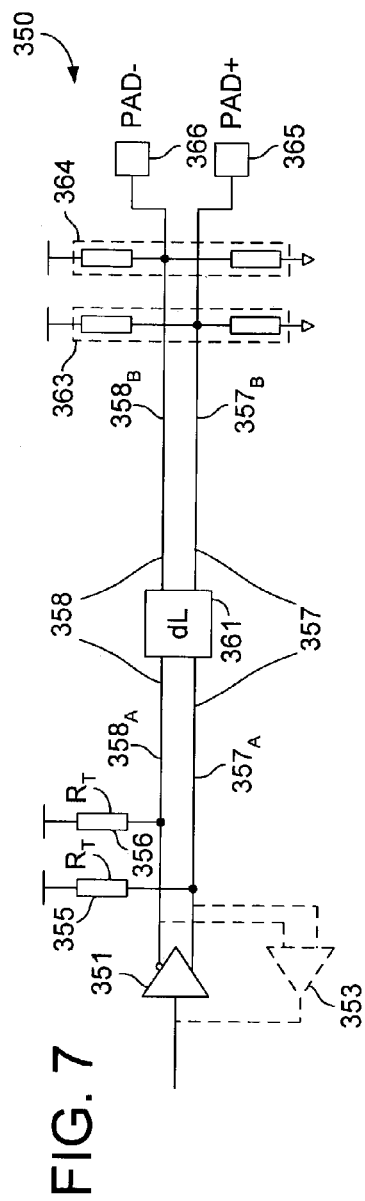
FIG. 7 illustrates a differential output circuit 350 according to an embodiment of the invention.

FIG. 7 illustrates a differential output circuit 350 according to an embodiment of the invention. The output circuit 350 includes a differential transmitter 351 (and/or differential receiver 353), differential signal lines (357, 358), termination elements (355, 356), a differential inductor 361, ESD structures (363, 364), and pads (365, 366), all disposed on one or more substrate layers of an integrated circuit. In one embodiment, the differential transmitter 351 includes a differential amplifier that sinks current on one of the signal lines 357, 358 while simultaneously enabling the other of the signal lines 357, 358 to be pulled up by the corresponding termination structure 355, 356. By this arrangement, current is effectively driven in opposite directions on the signal lines 357, 358, and ultimately on external signal paths coupled to pads 365 and 366. The differential inductor 361 includes a pair of component inductors disposed relative to one another in a manner that produces mutual inductance. That is, the component inductors are routed such that magnetic flux lines produced by the oppositely directed currents within the component inductors interfere constructively with one another, thereby increasing the total magnetic flux surrounding each inductor and boosting the total inductance of each component inductor. As with the inductive structure 209 of FIG. 4, the component inductors of the differential inductor 361 are coupled in series with lines 357 and 358, respectively; segmenting the signal lines 357 and 358 into respective interface segments ($357_A$, $358_A$) and termination segments ($357_B$, $358_B$) and distributing parasitic capacitances between the segments in the manner described in reference to FIG. 5.

Single-Layer, On-Chip Differential Inductor

Figure 8:
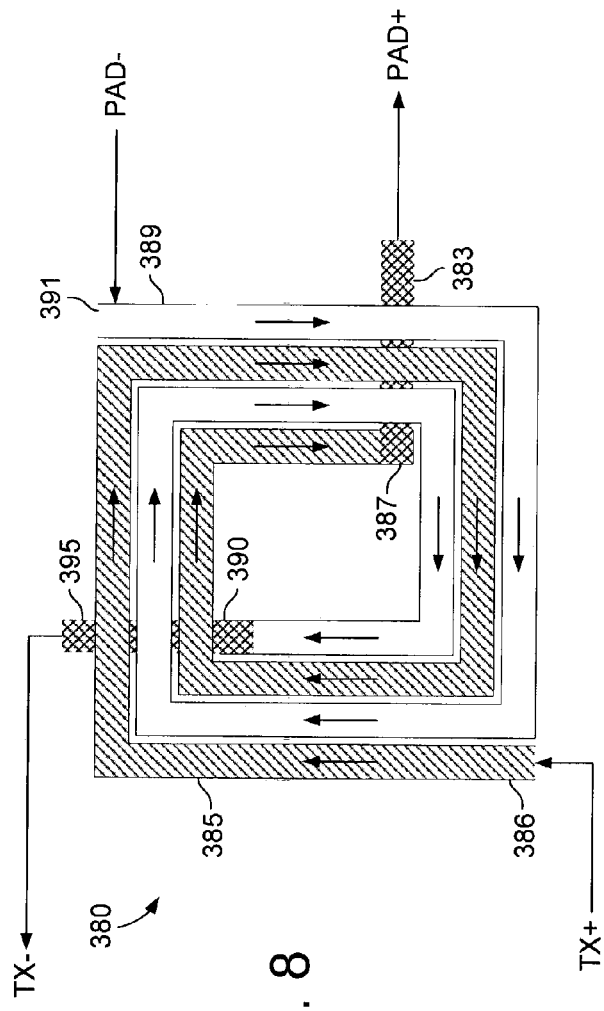
FIG. 8 illustrates a differential inductor according to an embodiment of the invention.

FIG. 8 illustrates a differential inductor 380 according to an embodiment of the invention. The differential inductor 380 includes a pair of spiral-wound conductors 385 and 389, each disposed within a single substrate layer of an integrated circuit. Each of the spiral-wound conductors 385, 389 is coupled between the termination segment and interface segment of a respective one of signal lines 357 and 358, with the routing direction of one of the conductors being opposite that of the other. That is, the conductor 385 is wound outside-in in a clockwise direction starting from termination-side node 386 and ending at interface-side node 387, while the conductor 389 is wound inside-out in a counterclockwise direction starting from termination-side node 390 and ending at interface-side node 391. The interface-side nodes, 387 and 391, are coupled to the interface line segments, $357_B$ and $358_B$, respectively, and the termination-side nodes, 386 and 390, are coupled to the termination line segments, $357_A$ and $358_A$, respectively. Consequently, when oppositely directed currents are generated on the termination line segments $357_A$ and $358_A$ (e.g., by differential transmitter 351 of FIG. 7), the reverse routing of the conductors 385 and 389 yields current flow in the same physical direction within the two conductors. As a result, the flux linkages generated by the currents flowing in the windings of conductors 385 and 389 constructively interfere with one another (i.e., add to one another) to produce a mutual inductance above and beyond the inductance of either conductor winding alone. Thus, using the differential inductor 380 of FIG. 8, a total inductance value may be achieved within a smaller winding area than in the absence of the mutual inductance produced by the reverse-direction winding of the component conductors 385 and 389.

In one embodiment, the conductors (385, 389) which form the differential inductor 380 are routed in parallel spirals that do not cross one another over the length of the winding. Consequently, the conductors 385 and 389 may be disposed within a single layer of a semiconductor substrate (e.g., a single metal layer). Interconnect segments 383 and 395 may be provided in a second substrate layer to couple the inner ends (387, 390) of the conductors 385 and 389 (i.e., the ends enclosed within the spiral winding) to the non-inverted-signal pad (PAD+) and the inverting terminal of a differential output driver (or a differential receiver), respectively. Note that in an alternative embodiment, the winding directions of each of the conductors may be reversed so that the conductor 385 is wound in a counterclockwise direction and the conductor 389 is wound in a clockwise direction. Also, the connections of the conductors to the non-inverting and inverting transmitter terminals (and to the corresponding connection pads) may be swapped.

Inductor Formed around Pad

Figure 9:
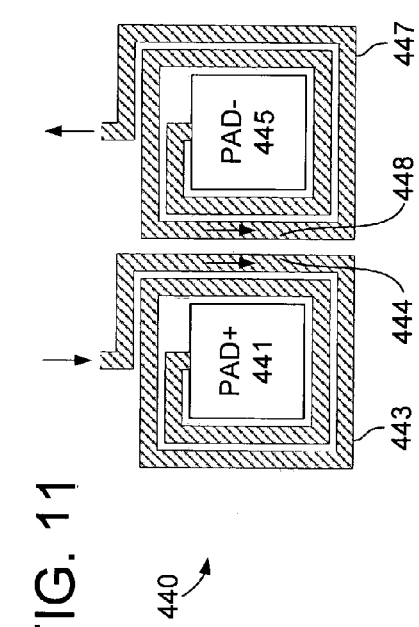
FIG. 9 illustrates an on-chip inductor according to an embodiment of the invention.
Figure 10:
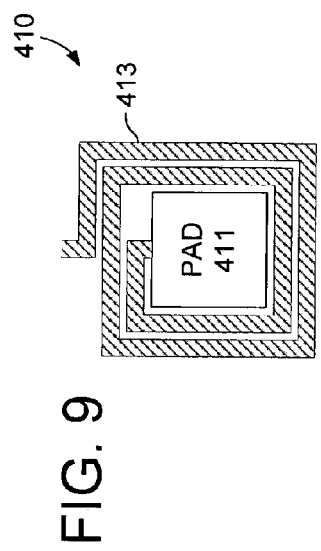
FIG. 10 illustrates stacked via structures used to boost inductance of an on-chip inductor.

FIG. 9 illustrates an on-chip inductor 410 according to an embodiment of the invention. As shown, the inductor 410 is formed by a conductor 413 coupled to a connection pad 411 and extending in a spiral configuration around the pad 411, thereby producing an area-efficient inductive structure. As shown in FIG. 10, one or more stacked via structures 421 may be constructed under the pad 411 using ferromagnetic material (or other material having reduced resistance to magnetic flux relative to the integrated circuit substrate), thereby producing a core which reduces the reluctance of the flux path 423 encircling the spiral-wound conductor 413 and boosts the inductance of the inductor. In one embodiment, the spiral wound conductor 413 is disposed in a metal layer, $METAL_N$, and the stacked via structures 421 are constructed in metal layers beneath $METAL_N$ (i.e., $METAL_{N-1}$, $METAL_{N-2}$, etc.). In alternative embodiments, other types of structures may be built under the pad to reduce the reluctance of the magnetic flux paths surrounding the spiral-wound conductor 413. Also, while the pad 411 is depicted as being coupled to the spiral-wound conductor 413 in FIGS. 9 and 10, the pad may alternatively (or additionally) be coupled to another conductor disposed, for example, in another layer of the integrated circuit substrate. The winding direction of conductor 413 may be opposite that shown in FIGS. 9 and 10 in an alternative embodiment. Note that the stacked via structures may be insulated from the pad by a substrate layer or other insulating material.

Differential Inductors Formed around Pads

Figure 11:
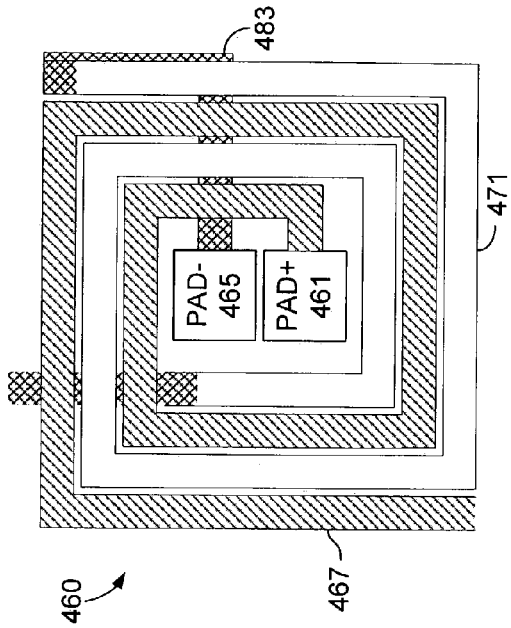
FIG. 11 illustrates a differential inductor implemented by adjacent, stepped instances of the on-chip inductor of FIG. 9.

FIG. 11 illustrates the use of adjacent, stepped instances of the on-chip inductor 410 of FIG. 9 to achieve mutual inductance in a differential inductor 440. A first on-chip inductor 443 is wound around a connection pad 441 (PAD+) for a non-inverted signal line and a second on-chip inductor 447 is wound around a connection pad 445 (PAD−) for a corresponding inverted signal line. Because the inductors 443 and 447 are stepped rather than mirrored images of one another, the windings of the inductors 443 and 447 are wound around their respective pads in the same direction (e.g., clockwise or counterclockwise). Because differential signal levels produce currents flowing through the two inductors 443 and 447 in opposite directions (i.e., a current flowing through one of inductors 443 and 447 toward the pad, and a current flowing through the other of the inductors 443 and 447 away from the pad), the currents in adjacent winding segments 444 and 448 flow in physically the same direction, thereby producing mutual inductance between the first and second inductors 443 and 447. Thus, winding the inductors 443 and 447 around their respective pads 441 and 445 produces area-efficient inductors, and the mutual inductance created by stepped orientation of the windings (i.e., conductor spiraled in same direction around each pad) increases the inductance of the inductors above that produced by either winding alone.

Figure 12:
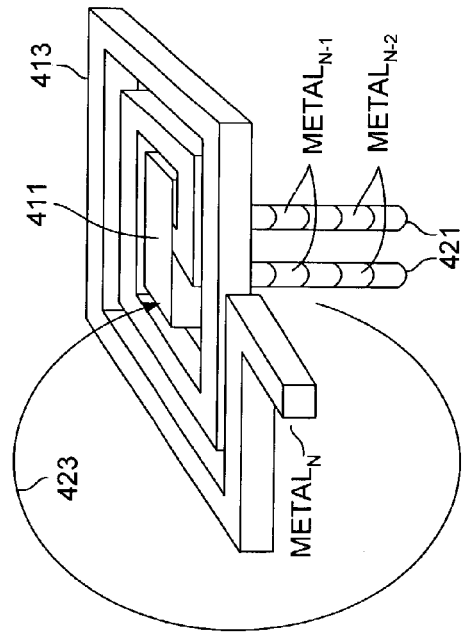
FIG. 12 illustrates a differential inductor wrapped around a pair of connection pads.

FIG. 12 illustrates a differential inductor 460 similar to the differential inductor 380 of FIG. 8, but with pads 461 and 465 enclosed within the windings of the conductors 467 and 471. In one embodiment, pad 465 is coupled to the outer end of the conductor 471 by a conductor 483 disposed in a substrate layer beneath (or above) the substrate layer on which the conductors 467 and 471 are disposed. Pad 461 is coupled to the inner end of the conductor 467. As described in reference to FIG. 8, the differential signals passing through the conductors 467 and 471 flow in the same physical directions, thereby producing a mutual inductance that increases the effective inductance of each winding. Winding the conductors 467 and 471 around the pads 461 and 465 further serves to increase the area-efficiency of the differential inductor 460.

It should be noted that the section headings provided in this detailed description are for convenience of reference only, and in no way define, limit, construe or describe the scope or extent of such sections. Also, while the invention has been described with reference to specific exemplary embodiments thereof, it will be evident that various modifications and changes may be made thereto without departing from the broader spirit and scope of the invention. Accordingly, the specification and drawings are to be regarded in an illustrative rather than a restrictive sense.

What is claimed is:

1. An integrated circuit device comprising:
   a signal line having a first signal line segment and a second signal line segment;
   an inductive structure disposed between the first and second signal line segments;
   a termination element coupled to the first signal line segment; and
   an electrostatic discharge (ESD) element coupled to the second signal line segment.

2. The integrated circuit device of claim 1 further comprising:
   a signal communication circuit coupled to the first signal line segment; and
   a connection pad coupled to an end of the second signal line segment to enable connection of the signal line to an external signal path.

3. The integrated circuit device of claim 2 wherein the inductive structure has an inductance according to a sum of parasitic capacitances, the sum including a parasitic capacitance of the signal communication circuit, a parasitic capacitance of the termination element, a parasitic capacitance of the ESD element and a parasitic capacitance of the connection pad.

4. The integrated circuit device of claim 2 wherein the signal communication circuit is a transmitter.

5. The integrated circuit device of claim 2 wherein the signal communication circuit is a receiver.

6. The integrated circuit device of claim 2 further comprising a substrate in which the signal line, termination element, ESD element, signal communication circuit, and connection pad are disposed.

7. The integrated circuit device of claim 6 further comprising:
   a housing to encapsulate the substrate;
   a pin extending from the housing to couple the integrated circuit device to the external signal path; and
   a bond wire coupled to the pin and the connection pad.

8. The integrated circuit device of claim 1 wherein the inductive structure comprises a third signal line segment disposed in a spiral-wound configuration and having a first end coupled to the first signal line segment and a second end coupled to the second signal line segment.

9. The integrated circuit device of claim 1 wherein the termination element comprises a termination circuit coupled between the first signal line segment and a first reference voltage node, the termination circuit having an input to receive a first control value and to generate a resistance between the first signal line segment and the first reference voltage node according to the first control value.

10. The integrated circuit device of claim 9 wherein the termination circuit comprises a plurality of transistors coupled between the first signal line segment and the first reference voltage node, and each transistor having a control input coupled to receive a respective bit of the first control value.

11. The integrated circuit device of claim 1 wherein the ESD element comprises a first diode coupled between the second signal line segment and a first reference voltage node.

12. The integrated circuit device of claim 11 wherein the first diode comprises a transistor coupled in a diode configuration.

13. The integrated circuit device of claim 11 wherein the ESD element further comprises a second diode coupled between the second signal line segment and a second reference voltage node.

14. An integrated circuit device comprising:
   a pair of output signal lines;
   a differential output driver to output differential signals onto the pair of output signal lines, the differential output driver exhibiting a parasitic capacitance; and
   a differential inductor coupled in between the differential output driver and the pair of output signal lines to compensate for the parasitic capacitance of the differential output driver.

15. The integrated circuit device of claim 14 wherein the differential inductor comprises:
   a first spiral-wound conductor having a first end coupled to the differential output driver and a second end coupled to a first one of the output signal lines, the first spiral-wound conductor being wound from the first end to the second end in a clockwise direction; and
   a second spiral-wound conductor having a first end coupled to the differential output driver and a second end coupled to a second one of the output signal lines, the second spiral-wound conductor being wound from the first end to the second end in a counterclockwise direction.

16. An integrated circuit comprising:
a first conductor disposed in a first continuous spiral within a first substrate layer the first conductor having a first end and a second end;
a second conductor disposed in a second continuous spiral within the first substrate layer, the second conductor having a first end and a second end, the second conductor adjacent the first conductor over the length of the second continuous spiral;
a signal communication circuit coupled to the first end of the first conductor and the second end of the second conductor;
a first connection pad coupled to the second end of the first conductor;
a second connection pad coupled to the first end of the second conductor, and
a third conductor disposed within a second substrate layer of the integrated circuit and coupled to the second end of the first conductor at an inner region of the first spiral.

17. The integrated circuit of claim 16 further comprising a fourth conductor disposed within the second substrate layer and coupled to the second end of the second conductor at an inner region of the second spiral.

18. A differential inductor comprising:
a first conductor disposed in a first continuous spiral within a first substrate layer of an integrated circuit;
a second conductor disposed in a second continuous spiral within the first substrate layer, the second conductor adjacent the first conductor over the length of the second continuous spiral;
a third conductor disposed within a second substrate layer of the integrated circuit and coupled to an end of the first conductor at an inner region of the first spiral; and
a via coupled between the end of the first conductor and the third conductor.

19. A differential inductor comprising:
a first conductor disposed in a first continuous spiral within a first substrate layer of an integrated circuit;
a second conductor disposed in a second continuous spiral within the first substrate layer, the second conductor adjacent the first conductor over the length of the second continuous spiral; and
a first and second connection pad disposed within a first region of the first substrate layer, the first region substantially enclosed within the first continuous spiral and the second continuous spiral.

20. The differential inductor of claim 19 wherein the first connection pad is coupled to an end of first conductor that is adjacent the first region.

21. The differential inductor of claim 20 further comprising a third conductor coupled between the second connection pad and an outer end of the second conductor.

22. The differential inductor of claim 21 wherein the third conductor is disposed within a second substrate layer of the integrated circuit.

23. An integrated circuit device comprising:
a substrate;
a first connection pad disposed on the substrate;
a first conductor disposed on the substrate and extending in a spiral configuration around the first connection pad to form a first inductive element, wherein the substrate includes a plurality of substrate layers, the first connection pad and the first conductor disposed on a first layer of the substrate; and
a plurality of ferromagnetic elements disposed within vias in layers of the substrate beneath the first layer to increase the inductance of the first inductive element.

24. The integrated circuit device of claim 23 wherein the plurality of ferromagnetic elements are stacked on one another within vias in respective layers of the substrate.

25. The integrated circuit device of claim 23 wherein the plurality of ferromagnetic elements are disposed beneath the first connection pad.

26. An integrated circuit device comprising:
a substrate;
a first connection pad disposed on the substrate;
a first conductor disposed on the substrate and extending in a spiral configuration around the first connection pad to form a first inductive element;
a second connection pad disposed on the substrate; and
a second conductor disposed on the substrate and extending in a spiral configuration around the second connection pad to form a second inductive element, the first and second conductors disposed adjacent one another and extending around the first and second connection pads, respectively, in the same direction.

27. The integrated circuit device of claim 26 further comprising a transmit circuit having differential outputs coupled respectively to the first and second conductors, the transmit circuit to generate currents flowing in opposite directions on the first and second conductors.

* * * * *